US006916729B2

(12) United States Patent
Fang et al.

(10) Patent No.: US 6,916,729 B2
(45) Date of Patent: Jul. 12, 2005

(54) SALICIDE FORMATION METHOD

(75) Inventors: Sunfei Fang, LaGrangeville, NY (US);
Keith Kwong Hon Wong, Wappingers Falls, NY (US); Paul D. Agnello, Wappingers Falls, NY (US); Christian Lavoie, Ossining, NY (US); Lawrence A. Clevenger, LaGrangeville, NY (US); Chester T. Dziobkowski, Hopewell Junction, NY (US); Richard J. Murphy, Clinton Corners, NY (US); Patrick W. DeHaven, Poughkeepsie, NY (US); Nivo Rovedo, LaGrangeville, NY (US); Hsiang-Jen Huang, Fishkill, NY (US)

(73) Assignees: Infineon Technologies AG, Munich (DE); International Business Machines Corporation, Armonk, NY (US)

( * ) Notice: Subject to any disclaimer, the term of this patent is extended or adjusted under 35 U.S.C. 154(b) by 2 days.

(21) Appl. No.: 10/409,516

(22) Filed: Apr. 8, 2003

(65) Prior Publication Data

US 2004/0203229 A1 Oct. 14, 2004

(51) Int. Cl.[7] .............................................. H01L 21/44
(52) U.S. Cl. ...................................................... 438/583
(58) Field of Search ................................ 438/518–583, 438/592, 721, 755, 785, 655, 664, FOR 360, 630, 649, 651, 682; 257/377, 382, 383, 388, 412, 413, E29.156, E29.161, E29.006

(56) References Cited

U.S. PATENT DOCUMENTS

| | | | | |
|---|---|---|---|---|
| 5,047,367 A | * | 9/1991 | Wei et al. | 438/607 |
| 5,902,129 A | * | 5/1999 | Yoshikawa et al. | 438/592 |
| 5,970,370 A | * | 10/1999 | Besser et al. | 438/586 |
| 6,121,139 A | * | 9/2000 | Chang et al. | 438/683 |
| 6,150,249 A | * | 11/2000 | Lee et al. | 438/592 |
| 6,399,467 B1 | | 6/2002 | Erhardt et al. | |
| 6,410,429 B1 | * | 6/2002 | Ho et al. | 438/655 |

OTHER PUBLICATIONS

Wolf, Stanley, et al., "Silicon Processing for the VLSI Era," vol. 1: Process Technology, Second Edition, Lattice Press, Sunset Beach, California, pp. 834–838.

* cited by examiner

*Primary Examiner*—George Fourson
*Assistant Examiner*—Brook Kebede
(74) *Attorney, Agent, or Firm*—Slater & Matsil, L.L.P.

(57) ABSTRACT

A method of forming a salicide on a semiconductor device includes depositing a first refractory metal layer over a silicon region of a substrate, depositing a near-noble metal layer over the first refractory metal layer, and depositing a second refractory metal layer over the near-noble metal layer. The semiconductor device is annealed in a first annealing process to form a silicide layer abutting the doped region of the semiconductor device. Un-reacted portions of the near-noble metal layer and the second refractory metal layer are removed. The device may be annealed in an optional second annealing process to convert the silicide layer to a low resistance phase silicide material. Junction leakage and bridging are minimized or eliminated by embodiments of the present invention, and a smoother silicided surface is achieved.

11 Claims, 6 Drawing Sheets

SALICIDE FORMATION METHOD

TECHNICAL FIELD

The present invention relates generally to semiconductor device fabrication, and more particularly to the formation of a salicide structure in semiconductor devices.

BACKGROUND

In semiconductor device manufacturing, suicides, which are alloys of silicon and metals, are often used. Silicides may be formed by the reaction of a refractory metal or a near-noble metal with silicon, and they are used in a variety of applications. For example, silicide may be used at the source/drain and/or gate area, or it may be used to construct a gate or local interconnect lines, as examples.

A salicide is a Self-ALigned suicide; the term salicide refers to a silicide formed by a self-aligning method. A salicide is typically formed by depositing a metal layer over a silicon layer, and then annealing the semiconductor structure. Where the metal is in contact with the silicon, a silicide is formed. Un-reacted metal is then selectively etched away, leaving the silicide automatically aligned to the underlying polysilicon layer; thus, it is referred to as a "salicide." The terms "silicide" and "salicide" are used interchangeably herein.

Salicide materials are commonly used in advanced CMOS technology. Salicides reduce sheet resistance and contact resistance, which is particularly advantageous when a salicide is disposed over the source, drain and gate region of a transistor, as an example. Titanium salicide ($TiSi_2$) has been used widely in CMOS technologies in the past. However, $TiSi_2$ has a strong line-width dependency of low resistance phase (C54) formation, and a relatively high formation temperature. Therefore, there is a trend towards using cobalt salicide ($CoSi_2$) rather than $TiSi_2$ as a salicide material, particularly in smaller scale CMOS technologies, such as sub-quarter-micron feature sizes.

However, the formation of $CoSi_2$ is challenging. Because cobalt does not reduce the amount of silicon surface oxide, as titanium does, the $CoSi_2$ formation process is sensitive to the condition of the underlying silicon surface. $CoSi_2$ formation is hindered or inhibited if there is a thick oxide layer disposed over the silicon surface. Also, while epitaxial $CoSi_2$ may be formed on an oxide-free silicon surface, such a $CoSi_2$ material formation tends to have {111} faceting, which increases junction leakage. The faceting occurs during epitaxial growth because of the cleaning process to prepare the surface such as an Argon sputter clean or HF dip clean without water rinse.

Another problem with $CoSi_2$ formation being sensitive to the condition of the silicon surface is that the process window is limited for $CoSi_2$ formation. As soon as the silicon surface is cleaned of any oxide, the oxide begins to regrow, for example. If oxide growth is too thick, a silicide cannot be formed, because there is no silicon at the surface to react with the metal. This leaves a very limited time window between surface clean and Co deposition for forming $CoSi_2$.

What is needed in the art is an improved method of forming a $CoSi_2$ salicide for semiconductor devices.

SUMMARY OF THE INVENTION

These and other problems are generally solved or circumvented, and technical advantages are generally achieved, by preferred embodiments of the present invention, which comprise methods of salicide formation using a tri-layer of Ti/Co/Ti. The thin bottom titanium layer reduces the surface oxide of the underlying semiconductor layer, reduces the semiconductor surface sensitivity and improves or reduces the salicide roughness. The thin top titanium layer diffuses through the cobalt to reduce the oxide at the surface of the underlying semiconductor layer, and reduces the chances of bridging.

In accordance with a preferred embodiment of the present invention, a method of forming a silicide includes providing a semiconductor substrate having at least one silicon region on a top surface thereof, disposing a first refractory metal layer over the top surface of the at least one silicon region, and disposing a near-noble metal layer over the first refractory metal layer. The method includes disposing a second refractory metal layer over the near-noble metal layer, annealing the semiconductor substrate in a first anneal process to form a silicide abutting the at least one silicon region, leaving a portion of the near-noble metal layer un-reacted. Un-reacted metals are then selectively removed.

In accordance with another preferred embodiment of the present invention, a method of forming a silicide includes providing a semiconductor substrate having at least one silicon region on a top surface thereof, disposing a first titanium layer over the top surface of the at least one silicon region, and disposing a cobalt layer over the first titanium layer. A second titanium layer is disposed over the cobalt layer, and the semiconductor substrate is annealed in a first annealing process to form a CoSi mono-silicide abutting the silicon region.

Advantages of the present invention include reducing the junction leakage and preventing the formation of bridging over the spacers of a transistor, for example. Embodiments of the invention provide methods of forming a salicide that are less sensitive to the condition of the silicon surface being silicided, resulting in a smoother salicide. The first refractory metal layer reduces the oxide layer over the silicon region, and reduces the silicon region surface roughness. Because the first refractory metal layer reduces the oxide on the surface of the silicided region, the process window is increased.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Problems with prior art cobalt silicide formation will be discussed, followed by a description of preferred embodiments of the present invention and some advantages thereof. The present invention will be described with respect to preferred embodiments in a specific context, namely a CMOS transistor. Embodiments of the invention may also be applied, however, to other semiconductor device applications where a silicide is desired to be formed.

Figure 1:
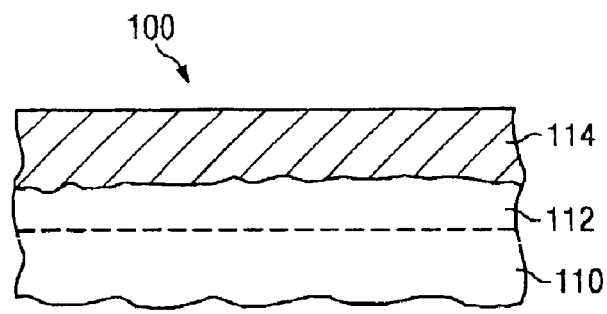
FIGS. 1 and 2 show cross-sectional views of a salicide process of the prior art, wherein rough surfaces of the material to be salicided results in faceted structures that are formed during the salicidation process.

Prior art methods of forming cobalt suicide will next be discussed. In FIG. 1, a semiconductor wafer or substrate 110 comprising silicon or other semiconductor materials, for example, has been implanted with dopants in a doped region 112 near the surface of the wafer 110. The doped region 112 may comprise a source or drain region of a transistor, for example. The top surface of doped region 112 is rough (e.g., not smooth) due to damage caused by the implantation process. To form a cobalt silicide over the doped region 112, first, the oxide (not shown) residing on the surface of the doped region 112 is removed. The oxide may be removed from the surface of doped region 112 by an argon sputter cleaning, or a diluted HF etch.

Figure 2:
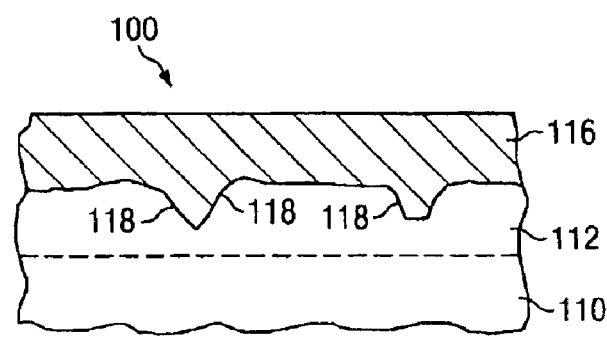

Next, a layer of cobalt 114 is deposited over the doped region 112. The cobalt layer 114 may be deposited using physical vapor deposition (PVD), for example. The wafer 110 is then annealed to cause a reaction of the cobalt 114 with the top portion of the silicon in the doped region 112 to form $CoSi_2$ 116, as shown in FIG. 2.

As the cobalt 114 diffuses downward into the doped region 112, silicon in the doped region 112 also diffuses up. In this manner, the $CoSi_2$ 116 is formed.

Cobalt silicide 116 formation is sensitive to the condition of the underlying silicon 112 surface. If a surface oxide exists over silicon in region 112 that is too thick, then no salicide 116 will be formed, because there are no silicon atoms to react to the cobalt atoms. However, if the surface is oxide-free, on this epitaxial method of forming $CoSi_2$, one disadvantage is that facets 118 are formed in a {111} direction as the cobalt silicide 116 is formed, as shown. These facets 118 are undesirable and may cause junction leakage in active devices.

Figure 3:
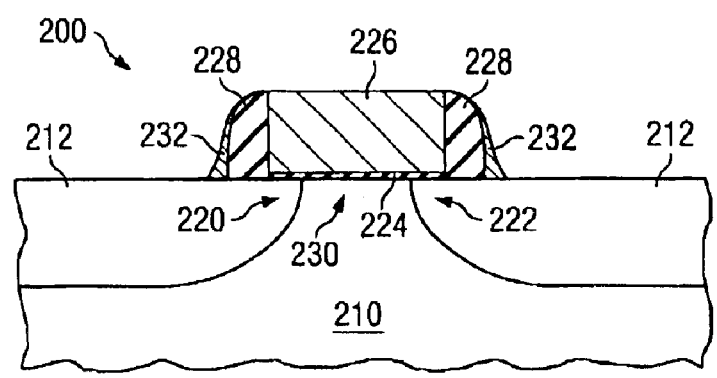
FIG. 3 shows a cross-sectional view of a prior art salicidation process wherein bridging regions are formed on the spacers abutting the gate electrode of a transistor.

FIG. 3 shows another problem that can occur in prior art salicide formation. Semiconductor device 200 includes a substrate 210 and doped regions 212 that have been formed within the substrate 210. Portion of the doped region 212 may comprise a source region 220 and a drain region 222. A channel 230 resides between the source region 220 and the drain region 222. A gate dielectric 224 has been formed over the channel 230 and portions of the source region 220 and the drain region 222. A gate conductor 226 has been formed over the gate dielectric 224, as shown. A spacer 228 is formed on each side of the gate electrode 226.

A problem with the semiconductor device 200 shown in FIG. 3 is that when a salicide is formed on the gate electrode 226, bridging regions 232 may be formed that abut the spacer 228 on either side of the gate electrode 226. These bridging regions 232 are caused by silicon 112 movement upwards along the side of the spacer 228. The bridging regions 232 may cause device failures, because the gate electrode 226 may be shorted to the source region 220 and/or the drain region 222, or to other components and conductors within the semiconductor device 200, not shown.

Figure 4A:
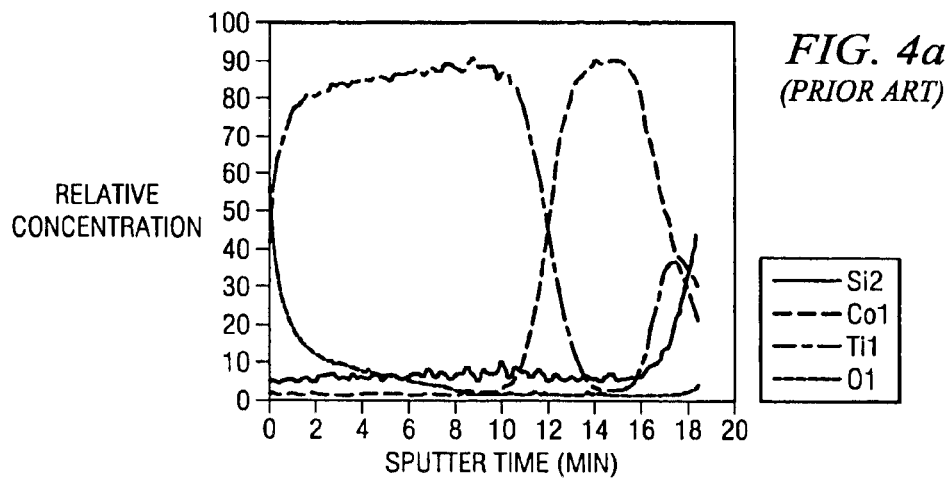
FIGS. 4a through 4c illustrate a reduction in an oxide layer over a silicided silicon region in accordance with a prior art method.
Figure 4B:
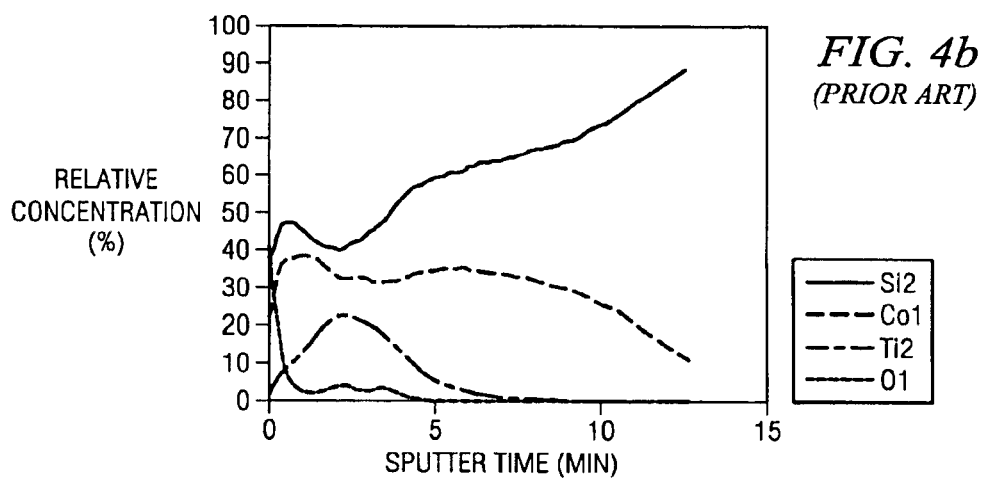
Figure 4C:
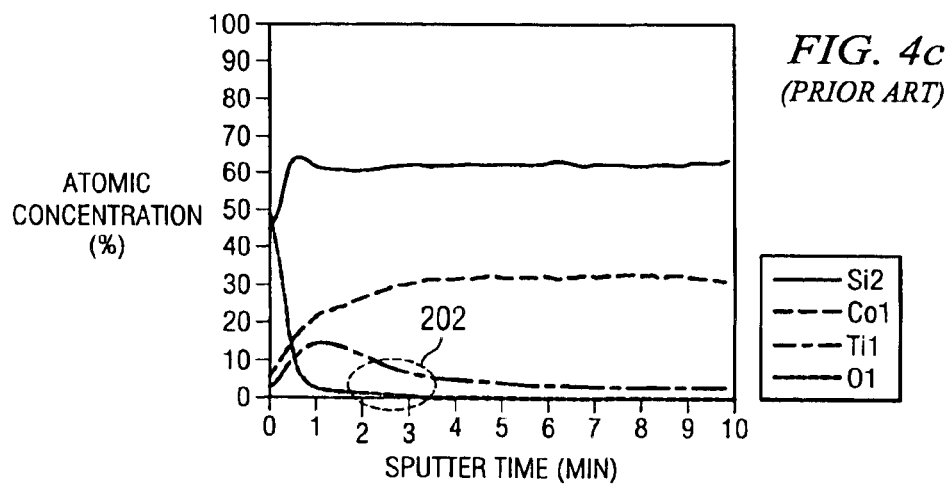

U.S. Pat. No. 5,047,367, issued on Sep. 10, 1991 to Wei, et al., which is incorporated herein by reference, discloses forming cobalt suicide by using a layer of titanium placed between a cobalt layer and silicon surface. The layer of Ti, which is 50 to 300 Å thick, removes native oxide on the surface of the silicon substrate. In FIG. 4a, test results are shown for the relative concentration measurements taken for a semiconductor wafer having a 30 Å titanium layer (Ti1), which is thinner than the thickness taught by Wei et al., deposited over n+ silicon (Si2), 80 Å of cobalt (Co1) deposited over the titanium layer Ti1, and a measurement of the oxide (O1) on the silicon substrate Si2 surface, as deposited. The relative concentrations of these materials are shown after a first anneal in FIG. 4b, and after a second anneal in FIG. 4c. The measurements are shown as a relative atomic concentration, and were measured using Auger Electron Spectroscopy. It can be seen that the titanium layer results in the reduction of the oxide, e.g., at 202. However, experimental results of using such a titanium layer beneath the cobalt layer can increase bridging that formed on spacers 228 by cobalt forming on the spacers 228 during the anneal, in this design, as shown in FIG. 3.

Figure 5A:
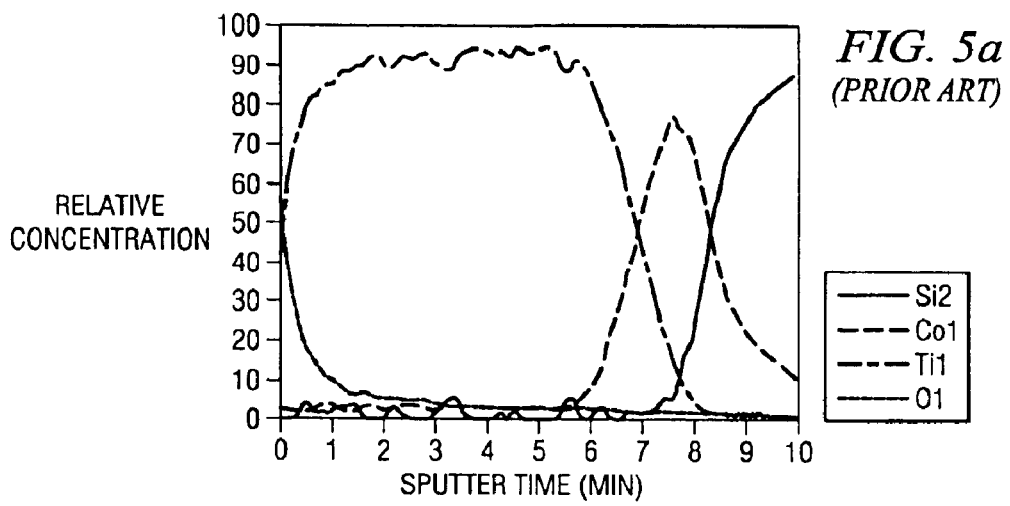
FIGS. 5a through 5c illustrate a reduction in an oxide layer over a silicided silicon region in accordance with another prior art method.
Figure 5B:
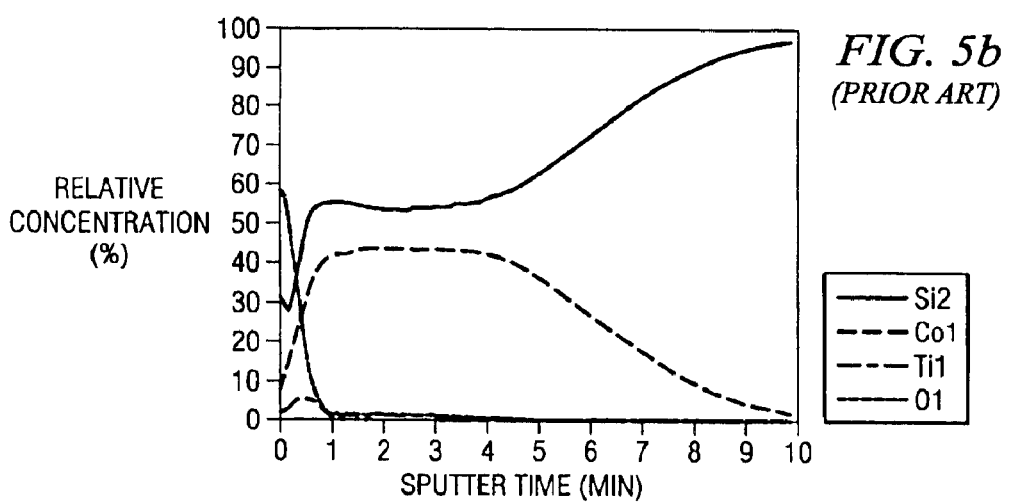
Figure 5C:
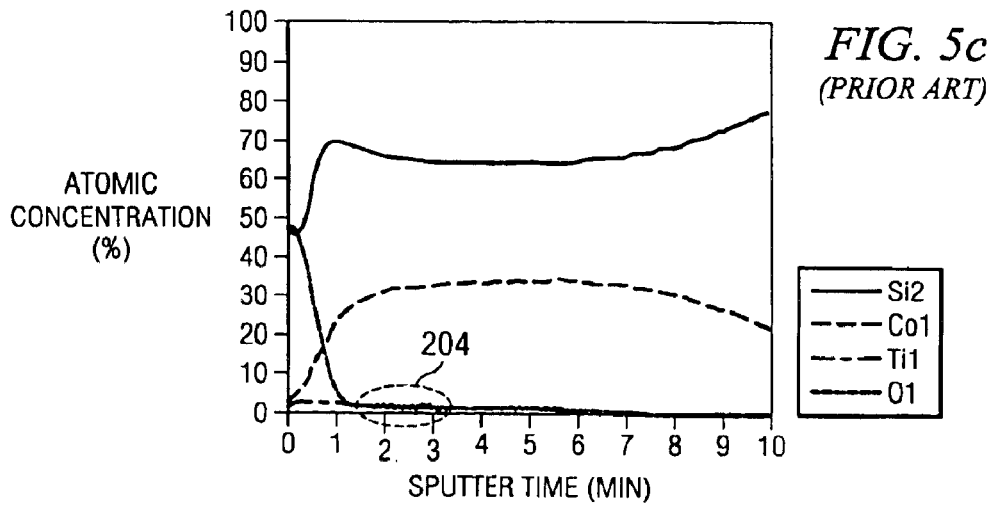

In U.S. Pat. No. 6,399,467 B1 issued on Jun. 4, 2002 to Erhardt et al., also incorporated herein by reference, a titanium cap layer is placed over a cobalt layer deposited over silicon, prior to annealing the wafer to form cobalt silicide. Such a titanium cap layer also results in reduced oxide, as shown in FIGS. 5a through 5c. In FIG. 5a, test results are shown for the relative concentration measurements taken for a semiconductor wafer having cobalt (Co1) deposited over over n+ silicon (Si2), a 30 Å titanium layer (Ti1) deposited over the cobalt Co1layer, and a measurement of the oxide (O1) on the silicon substrate Si2 surface, as deposited. The relative concentrations of these materials are shown after a first anneal in FIG. 5b, and after a second anneal in FIG. 5c. The titanium cap layer reduces the oxide O1, as can be seen in FIG. 5c at 204.

Figure 6:
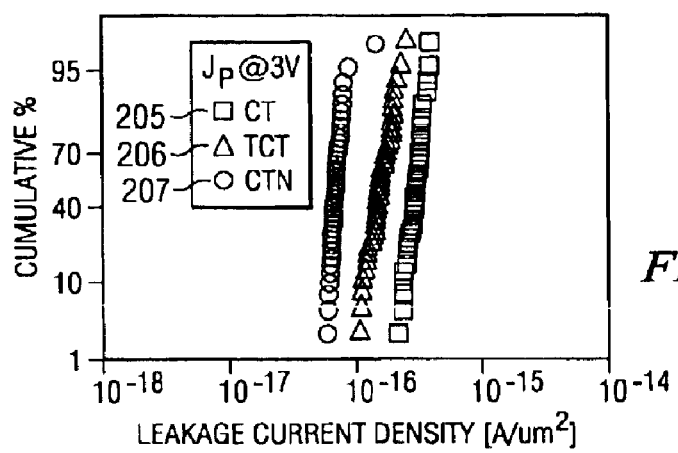
FIG. 6 is a graph showing the degraded junction leakage in a prior art silicidation method.

However, experimental results of such a Ti cap layer showed an increase in junction leakage, as shown in FIG. 6. FIG. 6 is a chart illustrating degraded junction leakage characteristics of a using including a titanium cap layer over the cobalt layer. The line at 205 represents the junction leakage 205 measured for a wafer having 13.5 nm of cobalt deposited over n+ silicon, and a titanium cap layer of 15 nm thickness deposited over the cobalt. The line at 206 represents the junction leakage 206 measured for a wafer having 15 nm of cobalt deposited over n+ silicon, and a titanium cap layer of 15 nm thickness deposited over the cobalt. A comparison is made to the line at 207, which shows the junction leakage 207 of a device wherein 12 nm of cobalt was deposited over n+ silicon, and 25 nm of TiN was deposited over the cobalt. Note that the junction leakage 205 and 206 in devices formed using a titanium cap layer is degraded compared to the junction leakage 207 for a device without a top titanium cap layer.

Embodiments of the present invention solve these problems in the prior art by providing a method of forming a salicide that is less sensitive to the condition of the silicon surface being silicided, that does not form bridging regions and suffers no increased or degraded junction leakage.

Figure 7A:
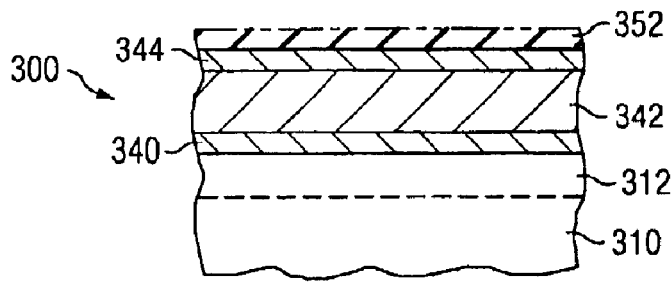
FIGS. 7a through 7c show cross-sectional views of the salicide formation process in accordance with an embodiment of the present invention.
Figure 7B:
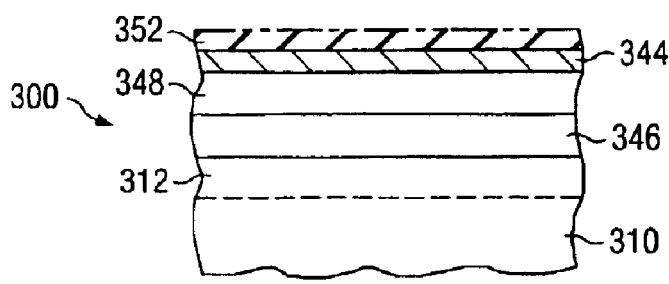
Figure 7C:
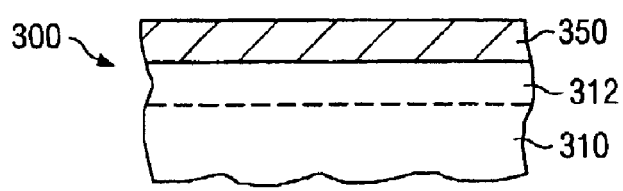

FIGS. 7a through 7c illustrate cross-sectional views of a method of forming a salicide in accordance with an embodiment of the present invention. Referring first to FIG. 7a, a semiconductor substrate 310 is provided, wherein the substrate 310 comprises a silicon substrate, for example. At least one doped region 312 is formed in a top area of the substrate 310. The doped area 312 may be formed by diffusion or implantation of dopants such as boron, phosphorus, or arsenic, as examples.

In accordance with an embodiment of the invention, first, the top surface of the doped region 312 is cleaned of native oxide or any other oxides that may have been previously deposited on the surface of the doped region 312. The oxide cleaning process preferably comprises an HF wet cleaning step followed by a water rinse, as an example, and alternatively may comprise other cleaning methods to remove the doped region 312 surface native oxide.

A first refractory metal layer 340 is then disposed over the doped region 312 of the substrate 310. The first refractory metal layer 340 preferably comprises titanium, and may alternatively comprise Zr, Hf, or other refractory metals, as examples. A refractory metal is defined herein as a metal that is heat resistant, has a relatively high melting temperature, and is adapted to reduce oxides. The first refractory layer 340 may be deposited by PVD or other deposition methods, for example. Preferably, the first refractory layer 340 is deposited using a controllable deposition process such as atomic layer deposition (ALD). When the first refractory metal layer 340 comprises titanium, the first refractory metal layer is preferably less than 50 Å thick, and more preferably, the first refractory metal layer is applied in a thickness of 10 to 15 Å, as examples. Preferably, the first refractory metal 340 comprises a very thin layer, e.g., only a few atomic layers thick.

A near-noble metal layer 342 is then disposed over the first refractory metal layer 340. The near-noble metal layer 342 preferably comprises cobalt, and may alternatively comprise nickel, or other near-noble metals such as Pd or Pt, as examples. A near-noble metal is defined herein as a metal that resembles a noble metal, which is a metal that does not enter readily into chemical combination with non-metals. The near-noble metal layer 342 may be deposited using PVD or other deposition methods such as ALD, as an example.

When the near-noble metal layer 342 comprises cobalt, the near-noble metal layer 342 preferably is deposited in a thickness of less than 150 Å, and more preferably comprises a thickness of 50–100 Å. As an example, the near-noble metal layer 342 may comprise a thickness of 80 Å.

A second refractory metal layer 344 is disposed over the cobalt layer 342. The second refractory metal layer 344 preferably comprises a thickness of less than 50 Å, deposited in a similar manner as the first refractory metal layer 340 is deposited. The second refractory metal layer 344 preferably comprises titanium, and may alternatively comprise Zr, Hf, or other refractory metals, as examples. The second refractory layer 344 may be deposited by PVD or other deposition methods, for example. Preferably, the first refractory layer 344 is deposited using a controllable deposition process such as ALD. The second refractory layer 344 may, for example, comprise the same material as the first refractory metal 340. As an example, the second titanium layer 344 may comprise a thickness of 10–15 Å. Preferably, the first refractory metal 340 and second refractory metal 344 comprise a very thin layer, e.g., they are preferably only a few atomic layers thick. Alternatively, particularly when an optional TiN cap 352 is not used, to be described further herein, the second refractory metal layer 344 may comprise a thickness in the range of 50 to 150 Å.

The semiconductor device 300 is then annealed, as shown in FIG. 7b, in a first annealing step. The temperature of the first annealing step is dependant upon the type of material used for the near-noble metal layer 342. For example, if the near-noble metal layer 342 comprises cobalt, the first annealing step preferably comprises a rapid thermal anneal (RTA) at 450–600° C., and more preferably, the first annealing step comprises a temperature of 575° C. The first annealing step may comprise 60 seconds or less, and more preferably may comprise 10 to 20 seconds, as an example.

During the first annealing step, the atoms of the near-noble metal layer 342, such as cobalt, diffuse downward toward the doped region 312 of the substrate 310. The diffusing cobalt or near-noble metal reacts with the silicon at the top surface of the dopant region 312 to form a silicide layer that abuts the doped region 312 of the substrate 310, as shown in FIG. 5. If cobalt is used for the near-noble metal layer 342, for example, a mono-silicide layer 346 is formed. The mono-silicide layer 346 may comprise CoSi, for example, which has a relative high resistance for a conductive material. Therefore, a second annealing step will later be performed on the semiconductor device 300, to reduce the resistance. The silicide layer 346, which comprises a mono-silicide in the case of a cobalt near-noble metal layer, formed may comprise a thickness of 100 to 160 Å, for example.

After the first annealing process, the un-reacted cobalt 348 remains disposed over the mono-silicide layer 346, which contains the reacted cobalt, as shown in FIG. 7b, and the second titanium layer 344 remains disposed over the un-reacted cobalt layer 348. A portion of the first refractory metal layer 340 diffuses upward towards the second refractory metal layer 344 during the first anneal or annealing step. A small portion or percentage of the first refractory metal layer 340 may react with the mono-silicide layer 346, resulting in the mono-silicide layer 346 comprising a small percentage of titanium, e.g., 10% by weight or less. Thus, the resulting di-silicide formed during the second annealing step may comprise an alloy that includes a small percentage of the material of the first refractory metal layer.

The second refractory metal layer 344 is then removed, leaving the structure shown in FIG. 7c. The un-reacted near-noble metal layer 348 comprising, e.g., cobalt, is also removed. The removal of the second refractory metal layer 344 and un-reacted near-noble metal layer 348 may require two separate etch or removal processing steps, as examples. The second refractory metal layer 344 and un-reacted near-noble metal layer 348 may be removed using a high selective wet etch processes, as an example a $H_2SO_4:H_2O_2$ solution. The removal of the un-reacted near-noble metal layer 348 prevents the formation of bridging during an optional subsequent second annealing step, which will be described next.

The semiconductor device 300 may then be annealed or exposed to an optional second annealing step, resulting in the structure shown in FIG. 7c. In the second annealing step, when cobalt is used for the near-noble metal layer 342, the mono-silicide 346 is converted to a di-silicide 350, comprising $CoSi_2$, for example, which has a low resistance and is therefore desirable as a conductor over the doped region 312. The second annealing step preferably comprises an anneal at a temperature higher than the first annealing step. If cobalt is used for the near-noble metal layer 342, the second annealing step preferably comprises a temperature of 600 to 800° C., and more preferably comprises an RTA at 750° C., as an example. The second annealing step may comprise 60 seconds or less, and more preferably comprises 10 to 30 seconds, as an example.

Both the temperature of the first annealing step and the temperature of the second annealing step are dependent upon the material of the near-noble metal layer. Also, the need for a second annealing step depends upon material for the near-noble metal layer 342. For example, if the near-noble metal layer 342 comprises nickel, then the first annealing step is at a lower temperature than if cobalt were used for the near-noble metal layer 342 material. For example, the first annealing step may range from 200 to 400° C. The first annealing step may result in a silicide 346 having a low resistance phase silicide material. The silicide 346 may comprise a mono-silicide 346, for example. In this case, the un-reacted portion of the near-noble metal layer and second refractory metal layer are removed, and subsequent processing of the semiconductor device is then performed.

However, a second annealing step may also be beneficial when nickel is used for the near-noble metal layer 342 material. For example, a second annealing step may lower the resistance phase of the silicide 346, and/or may expand the process window. For example, after the first annealing process, the silicide 346 may comprise a metal-rich silicide, and after removing the un-reacted portion of the near-metal layer to prevent bridging, a second annealing process may improve or lower the resistance of the silicide 346. If the near-noble metal layer 342 comprises nickel, then a second annealing process may range from 400 to 550° C. to fully form low resistance phase nickel monosilicide: NiSi, for example. Preferably, the second annealing process is a higher temperature than the first annealing process.

Figure 8A:
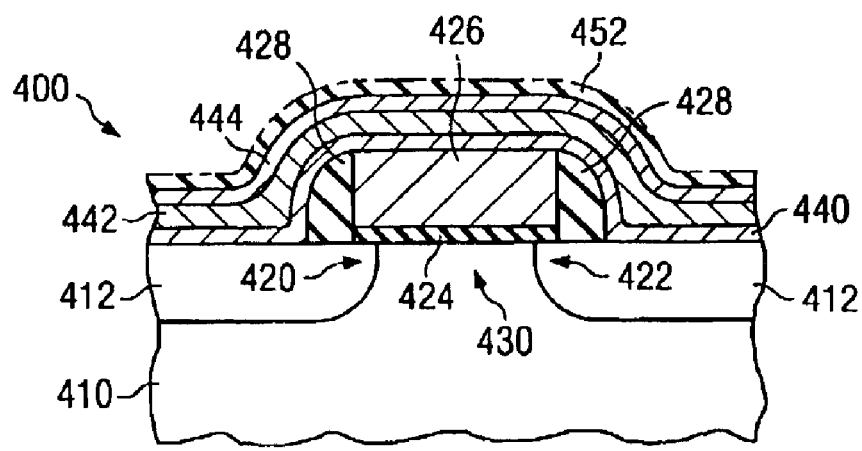
FIGS. 8a through 8b illustrate cross-sectional views of a salicide forming process in accordance with another embodiment of the present invention.
Figure 8B:
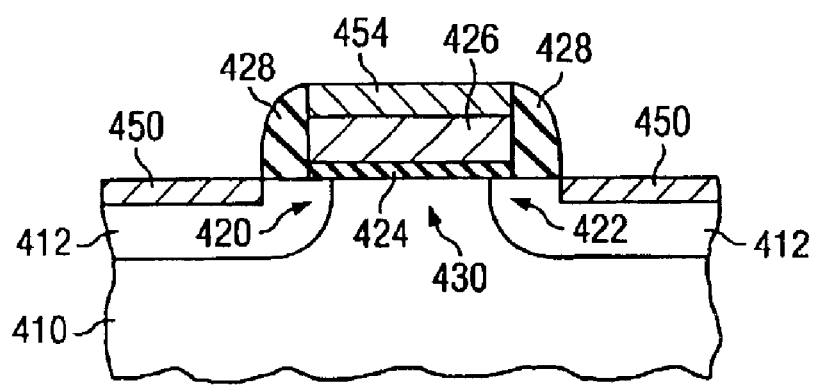

The doped regions 312 to be silicided may comprise many types of components, for example, transistors, diodes, capacitors, conductors, and other types of electronic circuitry components. A specific application of the salicide process described herein is shown in FIGS. 8a and 8b. In FIG. 8a, a substrate 410 is provided, wherein the substrate 410 has doped regions 412 formed therein. The doped regions 412 include a source region 420 and a drain region 422, with a channel region 430 being disposed between the source and drain regions 420 and 422. A gate dielectric 424 is disposed over at least the channel region 430, and a gate electrode 426 is formed over the gate dielectric 424. A spacer 428 may be formed on either side of the gate electrode 426, as shown.

In accordance with an embodiment of the invention, a first refractory metal layer 440 is disposed over at least the doped regions 412 and gate electrode 426, as shown. In a preferred embodiment, the first refractory metal layer 440 comprises titanium, although alternatively, the first refractory metal layer 440 may comprise other refractory metals, for example. A near-noble metal layer 442 is disposed over the first titanium layer 440. In a preferred embodiment, the near-noble metal layer 442 comprises cobalt, although alternatively, the near-noble metal layer 442 may comprise other near-noble metals, for example. A second refractory metal layer 444 is disposed over the cobalt layer 442. In a preferred embodiment, the second refractory metal layer 444 comprises titanium, although alternatively, the second refractory metal layer 444 may comprise other refractory metals, for example.

As described with reference to FIGS. 7a–7c, the semiconductor device 400 is exposed to a first annealing step to form a mono-silicide CoSi layer on the surface of the exposed doped regions 412 of the substrate 410. The second refractory metal layer 444 in un-reacted portions of the near-noble metal layer 442 is then removed, and then the device 400 is exposed to a second annealing step to convert the high resistance mono-silicide CoSi to a low resistance, di-silicide $CoSi_2$ 450, as shown in FIG. 8b. The resulting resistance of the di-silicide $CoSi_2$ 450 may be, for example, 15 to 25 $\mu\Omega$-cm.

Note that in the embodiment shown in FIGS. 8a and 8b, advantageously, if the gate electrode 426 comprises silicon, a layer of mono-silicide 454 also may be formed over the gate electrode 426, if the gate electrode 426 top surface is exposed to the first refractory metal layer 440, near-noble metal layer 442, second refractory metal layer 444, and optional cap layer 452 during the first annealing step. The mono-silicide 454 is then converted to a di-silicide during the second annealing step. The salicided regions 450 and 454 over the source 420 and drain 422 regions, and gate electrode 426, respectively, provide reduced resistance and improved conductivity of the source 420 and drain 422 regions and gate electrode 426, improving device speed and performance.

In one embodiment of the present invention, an optional oxidation preventing cap layer 352 or 452 may be disposed over the second refractory metal layer 344 or 444, as shown in phantom in FIGS. 7a, 7b and 8a. The oxidation preventing cap layer 352 or 452 preferably comprises titanium nitride, although the oxidation preventing cap layer 352 or 452 may comprise other passivating materials, such as tantalum nitride or silicon nitride, as examples. The oxidation preventing cap layer 352 or 452 may be 250 Å or less thick, and more preferably, may be between about 50 to 150 Å thick. In one embodiment, the oxidation preventing cap layer 352 or 452 comprises 150 to 200 Å of titanium nitride, for example. The titanium nitride layer is removed prior to the second annealing step, as is the second titanium layer 344 and 444 and the un-reacted cobalt layer 348 and 442, as shown in FIGS. 7b and 8a.

The optional titanium nitride cap layer 352 and 452 is advantageous because it prevents the oxidation of the refractory metal layer 344 and 444 and the near-noble layer 342 and 442. Titanium nitride layer 352 and 452 also provides the ability to deposit a thinner layer of second refractory metal layer 344 and 444.

When an optional oxidation preventing cap layer 352 and 452 is not used, the second refractory metal layer 344 and 444 prevents the underlying near-noble metal layer 342 and 344 from oxidizing, and assists in the formation of a low resistance silicide during the annealing steps. Preferably, when the optional oxidation preventing cap layer 352 and 452 are not used, the second refractory metal layer 344 and 444 are thicker than the first refractory metal layer 340 and 440.

A small percentage of titanium may remain in the $CoSi_2$ layer 350 and 450 formed in accordance with embodiments of the present invention, for example. Embodiments of the present invention also include a semiconductor device and a transistor device manufactured in accordance with the methods described herein, for example.

$CoSi_2$ formation is very sensitive to the underlying surface 312 and 412 condition. Advantageously, the novel use of a thin titanium or refractory metal layer 340 and 440 disposed over and abutting the substrate 312 and 412 surface, combined with a thin titanium or refractory metal layer 344 and 444 disposed over the cobalt or near-noble layer 342 and 442, results in the substrate 312/412 surface oxidization being substantially reduced. This results in a salicide layer formation having a smooth surface, in particular, decreased surface roughness.

Figure 9A:
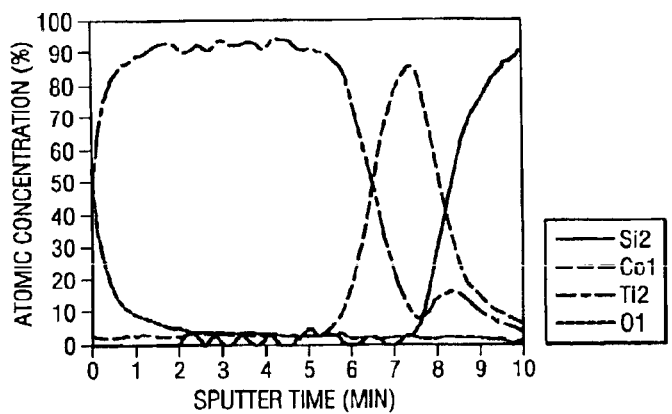
FIGS. 9a through 9c show the reduction in oxide in accordance with experimental results of an embodiment of the present invention.
Figure 9B:
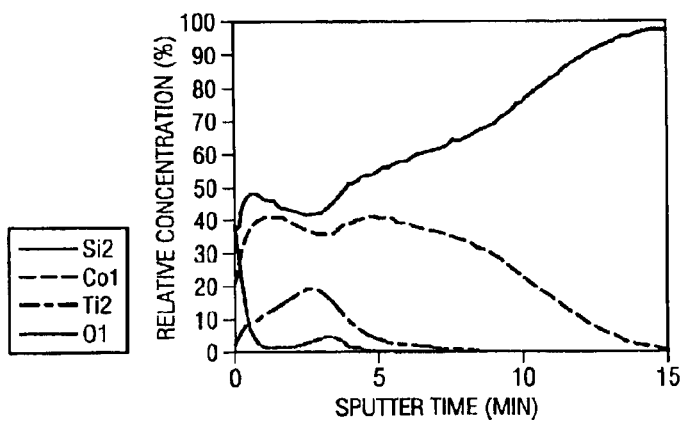
Figure 9C:
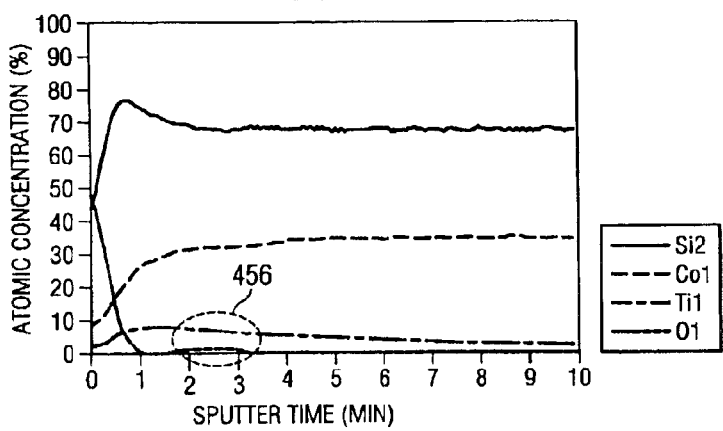

FIGS. 9a through 9c illustrate experimental results of a device manufactured in accordance with an embodiment of the present invention. In FIG. 9a, test results are shown for the relative concentration measurements taken for a semiconductor wafer having a 15 Å first titanium layer (Ti2) deposited over n+ silicon (Si2), a 80 Å cobalt layer (Co1) deposited over the first titanium layer, a 15 Å titanium layer (Ti2) deposited over the cobalt Co1 layer, and a measurement of the oxide (O1) on the silicon substrate Si2 surface, as deposited. A 200 Å TiN cap layer was deposited over the second titanium layer. The relative concentrations of these materials are shown after a first anneal in FIG. 9b, and after a second anneal in FIG. 9c. The thin 15 Å first and second titanium layers sandwiching the cobalt Co1 layer unexpectedly substantially reduced the oxide O1 thickness, as can be seen in FIG. 9c at 456.

Another unexpected result of embodiments of the present invention include a substantial reduction of the resulting salicide surface roughness. Table 1 illustrates the surface roughness, measured in an Atomic Force Microscope (AFM), for the same embodiment described for FIGS. 9a through 9c. The silicide surface roughness was measured in a 5 μm×5 μm area for each device. The range of roughness measured is shown in nm. The embodiment of the present invention tested resulted in a reduced roughness of more than half when compared to a salicided device formed using a Ti layer formed over a cobalt layer, as taught by Erhardt et al., for example. Similarly, the salicide surface roughness was reduced by 28% when compared to a salicided device formed using a Ti layer formed between the cobalt layer and the Si, as taught by Wei et al. (although, a thinner layer of Ti was used in the experiment than is taught by Wei et al.).

TABLE 1

| Original Structure | RMS (nm) |
| --- | --- |
| n + Si; 80 Å of cobalt deposited over the Si, and 200 Å TiN deposited over the cobalt | 2.461 to 2.524 |
| n + Si, 30 Å Ti deposited over the Si, 80 Å cobalt deposited over the Ti, and 200 Å TiN deposited over the Ti | 2.101 to 2.163 |
| n + Si, 80 Å cobalt deposited over the Si, 30 Å Ti deposited over the cobalt, and 200 Å TiN deposited over the Ti (prior art - | 3.792 to 4.141 |

TABLE 1-continued

| Original Structure | RMS (nm) |
| --- | --- |
| Erhardt, et al.) | |
| n + Si, 80 Å cobalt deposited over the Si, 30 Å Ti deposited over the cobalt, and 200 Å TiN deposited over the Ti (an embodiment of the present invention) | 1.492 to 1.609 |

Thus, advantages of embodiments of the present invention include reducing the oxide at the silicon surface, while at the same time improved or reducing the roughness of the silicide 350/450 surface, and reducing the chance of bridging (as shown in FIG. 3). Reducing the roughness of the silicide 350/450 surface results in reducing the junction leakage. Because the near-noble metal layer 342 and 442 is sandwiched between two refractory metal layers 340/440 and 344/444, in accordance with embodiments of the present invention, the substrate oxide may be reduced and the silicide 350/450 surface roughness may be improved, without creating silicide bridging or degrading junction leakage. Because the first refractory metal layer 340/440 reduces any oxide on the top surface of the silicided region 312/412, the process window is increased. Furthermore, because silicide bridging is prevented, the methods described herein result in improved yields.

Although embodiments of the present invention and some advantages thereof have been described in detail, it should be understood that various changes, substitutions and alterations can be made herein without departing from the spirit and scope of the invention as defined by the appended claims. For example, it will be readily understood by those skilled in the art that the processes, materials, and order of process steps may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming a silicide, comprising: providing a semiconductor substrate having at least one silicon region on a top surface thereof; disposing a first titanium layer over the top surface of the at least one silicon region said first titanium layer having a thickness of less than about 50 Å; disposing a cobalt layer over the first titanium layer, having a thickness of between about 50A and 100A; disposing a second titanium layer, having a thickness of between about 10 Å and 15 Å, over the cobalt layer; and disposing an oxidation preventing cap layer over the second titanium layer; and then annealing the semiconductor substrate in a first annealing process to form a CoSi mono-silicde abutting the silicon region.

2. The method according to claim 1, further comprising removing at least the un-reacted cobalt from over the semiconductor substrate, after the first annealing process.

3. The method according to claim 2, further comprising annealing the semiconductor substrate in a second annealing process at a temperature of between about 600° C. and 800° C. for less than 60 seconds to convert the CoSi mono-silicide to a $CoSi_2$ di-silicide.

4. The method according to claim 3 wherein the di-silicide includes a percentage of titanium.

5. The method according to claim 2, wherein said oxidation preventing cap layer comprises a titanium nitride layer and further comprising removing the titanium nitride, after the first annealing process.

6. The method according to claim 5, wherein disposing a titanium nitride layer comprises disposing 250 Å or less of titanium nitride.

7. The method according to claim 3, wherein the first annealing process is at 450 to 600° C. for 10–20 seconds, and wherein the second annealing process is for 10–30 seconds.

8. The method according to claim 1, wherein disposing the cobalt layer comprises disposing cobalt in a thickness of about 80 Å.

9. The method of claim 1, wherein providing a semiconductor substrate comprises providing a semiconductor substrate having at least one transistor formed therein, the transistor including:
- a source region formed in the substrate;
- a drain region formed in the substrate, wherein a channel region is defined between the source region and the drain region;
- a gate dielectric formed over at least the channel region;
- a gate electrode formed over the gate dielectric, wherein the source region and drain region of the transistor comprise the at least one silicon region.

10. The method according to claim 9, wherein the gate electrode comprises silicon, wherein a CoSi mono-silicide is formed on the gate electrode during the first annealing process.

11. The method of claim 1, further comprises forming the first titanium layer having a thickness of between about 10 Å and 15 Å.

* * * * *

UNITED STATES PATENT AND TRADEMARK OFFICE
CERTIFICATE OF CORRECTION

PATENT NO. : 6,916,729 B2
DATED : July 12, 2005
INVENTOR(S) : Fang et al.

It is certified that error appears in the above-identified patent and that said Letters Patent is hereby corrected as shown below:

Column 10,
Line 58, delete "50A and 100A" and insert -- 50 Å and 100 Å --.

Signed and Sealed this

Twenty-ninth Day of November, 2005

JON W. DUDAS
*Director of the United States Patent and Trademark Office*